(12) United States Patent
Chang et al.

(10) Patent No.: US 9,166,117 B2
(45) Date of Patent: Oct. 20, 2015

(54) LIGHT EMITTING DEVICE AND METHOD FOR MIXING LIGHT THEREOF

(71) Applicant: ADVANCED OPTOELECTRONIC TECHNOLOGY, INC., Hsinchu Hsien (TW)

(72) Inventors: Chung-Min Chang, Hsinchu (TW); Chien-Lin Chang-Chien, Hsinchu (TW); Hsuen-Feng Hu, Hsinchu (TW); Chang-Wen Sun, Hsinchu (TW); Ya-Ting Wu, Hsinchu (TW)

(73) Assignee: ADVANCED OPTOELECTRIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/066,706

(22) Filed: Oct. 30, 2013

(65) Prior Publication Data
US 2014/0177216 A1    Jun. 26, 2014

(30) Foreign Application Priority Data
Dec. 25, 2012   (CN) .......................... 2012 1 0569000

(51) Int. Cl.
*H01L 33/50*    (2010.01)
*F21V 9/16*    (2006.01)
*H01L 25/075*    (2006.01)

(52) U.S. Cl.
CPC ............. *H01L 33/50* (2013.01); *H01L 25/0753* (2013.01)

(58) Field of Classification Search
USPC .......................................................... 313/501
See application file for complete search history.

(56) References Cited

U.S. PATENT DOCUMENTS

| 6,234,648 | B1 * | 5/2001 | Borner et al. .................. 362/235 |
| 2003/0067773 | A1 * | 4/2003 | Marshall et al. ............... 362/231 |
| 2005/0211992 | A1 * | 9/2005 | Nomura et al. .................. 257/79 |
| 2006/0289880 | A1 * | 12/2006 | Kurihara .......................... 257/89 |
| 2008/0048193 | A1 | 2/2008 | Yoo et al. |
| 2010/0252847 | A1 * | 10/2010 | Chiu et al. ....................... 257/98 |
| 2013/0015461 | A1 * | 1/2013 | Lin ................................. 257/76 |

FOREIGN PATENT DOCUMENTS

| CN | 201209828 Y |   | 3/2009 |
| JP | 60170194 A | * | 9/1985 |
| JP | 2003298113 A | * | 10/2003 |
| TW | 201244186 A1 |   | 11/2012 |

OTHER PUBLICATIONS

Machine English translation of JP2003298113 to Nagata et al.*

* cited by examiner

*Primary Examiner* — Sikha Roy
(74) *Attorney, Agent, or Firm* — Novak Druce Connolly Bove + Quigg LLP

(57) ABSTRACT

An exemplary light emitting device includes a blue-green light source and a orange-red light source. The blue-green light source emits blue-green light and the orange-red light source emits orange-red light when they are activated. The blue-green light and the orange-red light are mixed together to obtain white light.

8 Claims, 4 Drawing Sheets

LIGHT EMITTING DEVICE AND METHOD FOR MIXING LIGHT THEREOF

BACKGROUND

1. Technical Field

The disclosure generally relates to light sources, particularly, to light-emitting devices emitting white light by mixing blue-green light and orange-red light.

2. Description of Related Art

Conventionally, a white light-emitting device is obtained by combining a blue light-emitting diode (LED) and a yellow phosphor layer. FIG. 1 shows a spectrum of the light emitted from the conventional white light-emitting device. Obviously, the light emitted from the conventional white light emitting device includes blue light having a wave crest 1 near 441 nm. Because the blue light having a wavelength near 441 nm has high light intensity, the white light emitted from the conventional white light emitting device is prone to causing damage to human eyes.

What is needed, therefore, is a light emitting device and a method for mixing light thereof which can overcome the above-described shortcomings.

DETAILED DESCRIPTION

Figure 2:
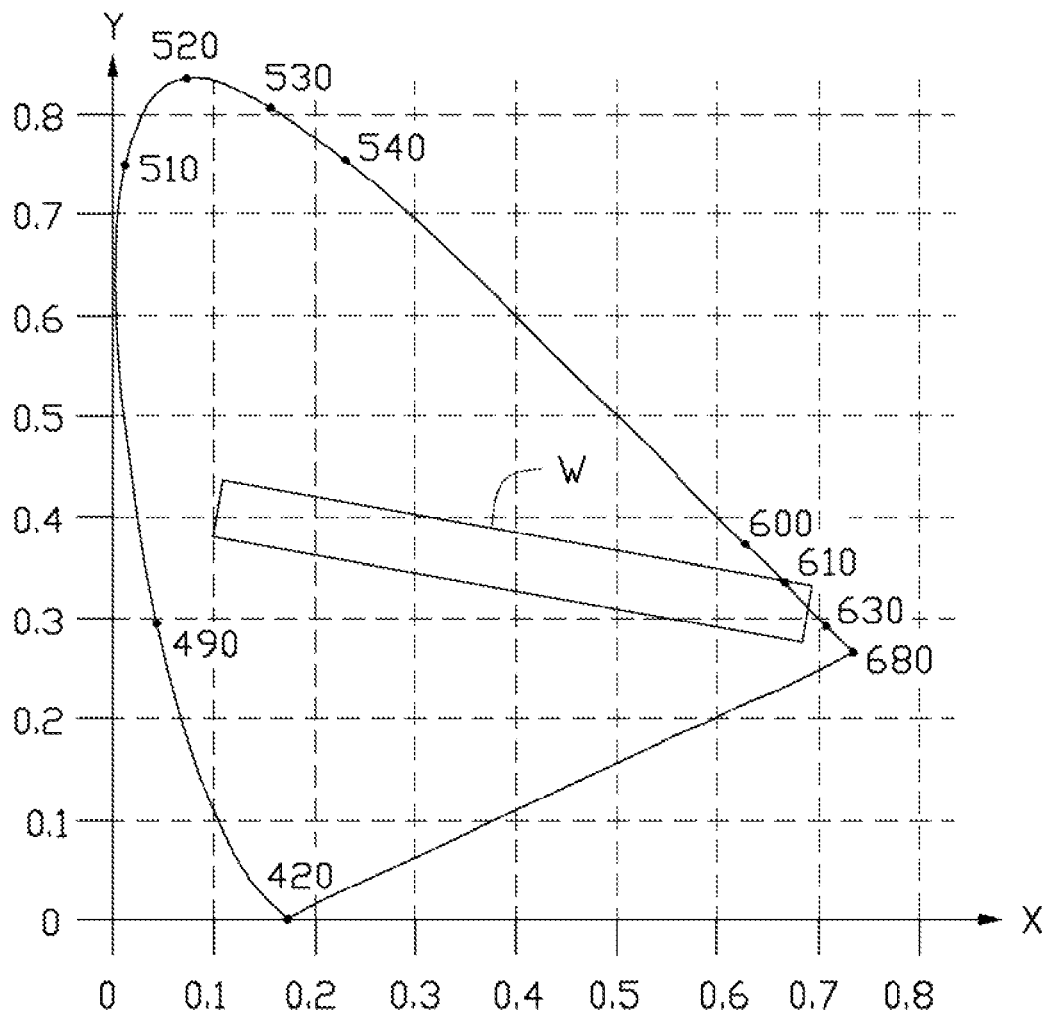
FIG. 2 is a CIE (International Commission on Illumination) 1931 xy chromaticity diagram of light obtained by a method for mixing light according to the present disclosure.

Referring to FIG. 2, a CIE 1931 xy chromaticity diagram of white light obtained by a light mixing method in accordance with the present disclosure is provided.

The method for mixing light in accordance with the present disclosure includes following steps: providing a blue-green light source and an orange-red light source, the blue-green light source emitting blue-green light, and the orange-red light source emitting orange-red light; mixing the blue-green light and the orange-red light to obtain a white light.

In the CIE 1931 xy chromaticity diagram of FIG. 2, the blue-green light is concentrated in the range of the coordinates (x: 0-0.3, y: 0.3-0.8); the orange-red light is concentrated in the range of the coordinates (x: 0.4-0.8, y: 0.2-0.5). In this embodiment, specifically, the light emitted from the blue-green light source and the light emitted from the orange-red light are concentrated at opposite parts of a range W in FIG. 2.

In this embodiment, the range W is rectangular. The mixed white light is concentrated at a middle part of the rectangular range W. The rectangular range W is inclined along a direction from the blue-green light which is located at an upper, left part of the range W towards the orange-red light which is located at a lower, right part of the range W. Specifically, a left edge of the rectangular range W is located in the range of blue-green light, and a right edge of the rectangular range W is located in the range of orange-red light. The left edge is located at a coordinate of the CIE 1931 xy chromaticity diagram wherein x is 0.1 and y is 0.4 while the right edge is located at a coordinate wherein x is 0.685 and y is 0.3.

Alternatively, in the rectangular range W, two kinds of light at any two points on a straight line through a central point of the rectangular range W and equidistant from the central point of the rectangular range W, can be mixed together to obtain a white light.

Figure 1:
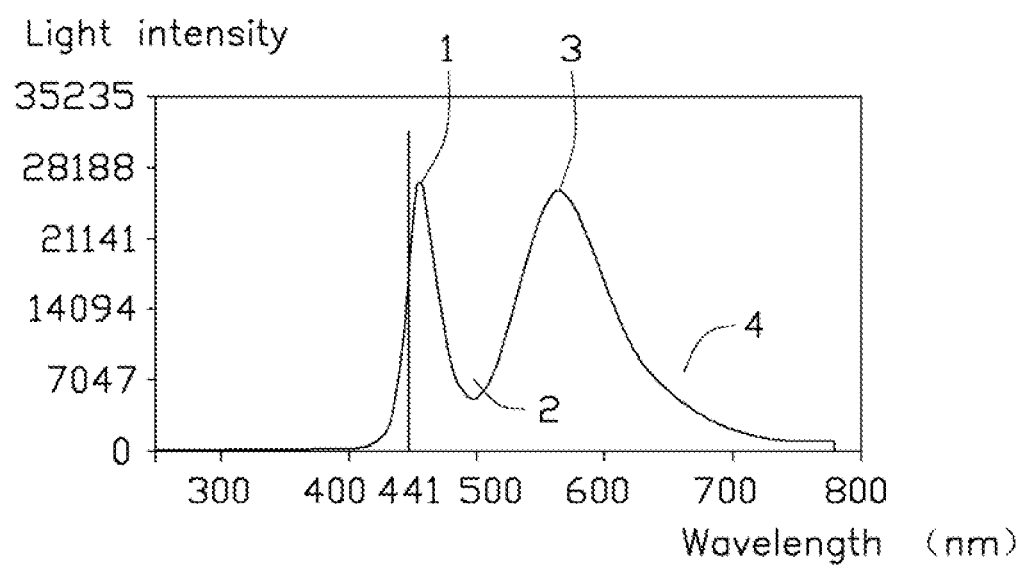
FIG. 1 is a spectrum of light emitted from a conventional white light emitting device in accordance with prior art.

In the visible spectrum, light having a wavelength near 435 nm-480 nm is blue light, which is corresponding to the light in the range at a left side of the wave crest 1 of FIG. 1; light having a wavelength near 490 nm-500 nm is blue-green light, which is corresponding to the light in the range from a right side of the wave crest 1 to the wave trough crest 2 of FIG. 1; light having a wavelength near 577 nm-597 nm is yellow light, which is corresponding to the light in the range near the wave crest 3 of FIG. 1; light having a wavelength near 580 nm-622 nm is orange-red light, which is corresponding to the range from the wave crest 3 toward the wave trough 4 of FIG. 1.

In this embodiment, the white light is obtained by mixing the blue-green light having a peak wavelength longer than 490 nm and the orange-red light having a peak wavelength longer than 580 nm.

Compared with the spectrum of FIG. 1, both of the two wave crests 1, 3 of the white light obtained by the present disclosure are moved rightwards along a direction from a shorter wavelength towards a longer wavelength. In the method for mixing light of the present disclosure, because the blue light source having a peak wavelength near 455 nm, is replaced by the blue-green light source having a peak wavelength longer than 490 nm, the damage to human eyes caused by the blue light is avoided, especially the damage caused by the blue light having a wavelength near 441 nm to human eyes is avoided by the white light in accordance with the present disclosure. And also, the color rendering property of the white light obtained by the method of mixing the blue-green light and the orange-red light is improved since the white light obtained by the present disclosure has a spectrum which is more similar to that of sunlight.

Figure 3:
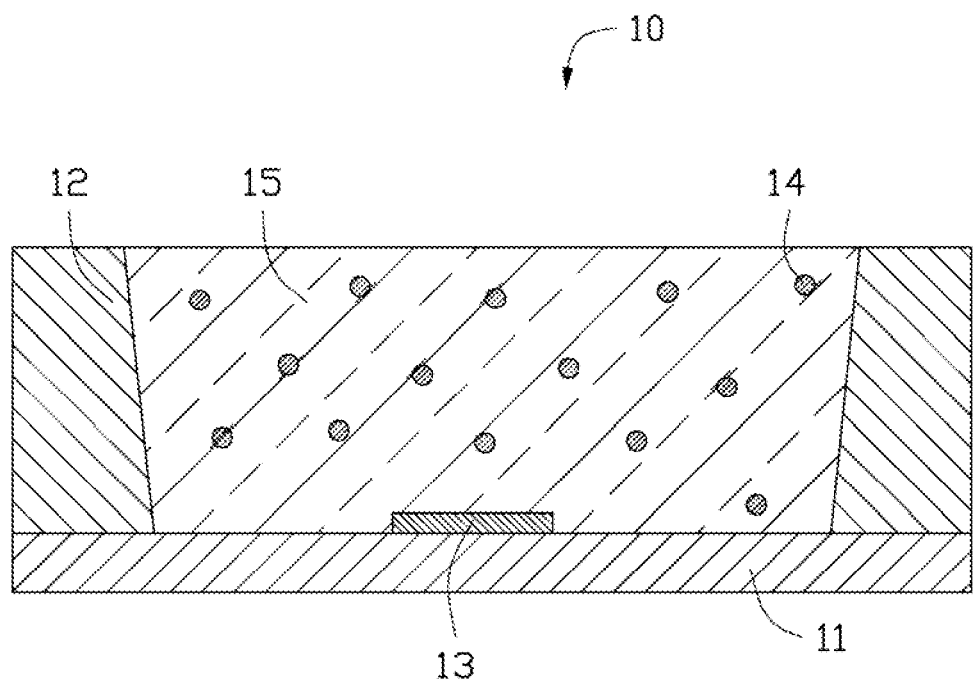
FIG. 3 is a cross sectional view of a light emitting device according to a first embodiment of the present disclosure.

Referring to FIG. 3, a light emitting device 10 in accordance with a first embodiment of the present disclosure is provided. The light emitting device 10 includes a substrate 11, a reflecting cup 12 arranged on the substrate 11, a first light emitting chip 13 located on the substrate 11 and surrounded by the reflecting cup 12, and an encapsulation layer 15 received in the reflecting cup 12 and covering the first light emitting chip 13 therein. The encapsulation layer 15 includes, for example, transparent silicone and fluorescence powder 14 scattering in the transparent silicone. The fluorescence powder 14 is located on light paths of the first light emitting chip 13. The first light emitting chip 13 emits blue-green light or orange-red light. And correspondingly, the fluorescence powder 14 is excited by the light emitted from the first light emitting chip 13 to emit orange-red light when the first light emitting chip 13 emits blue-green light or blue-green light when the first light emitting chip 13 emits orange-red light. That is, the light emitting device 10 includes a blue-green light source and an orange-red light source. The blue-green light and the orange-red light are mixed together to obtain the white light in accordance with the present disclosure.

Figure 4:
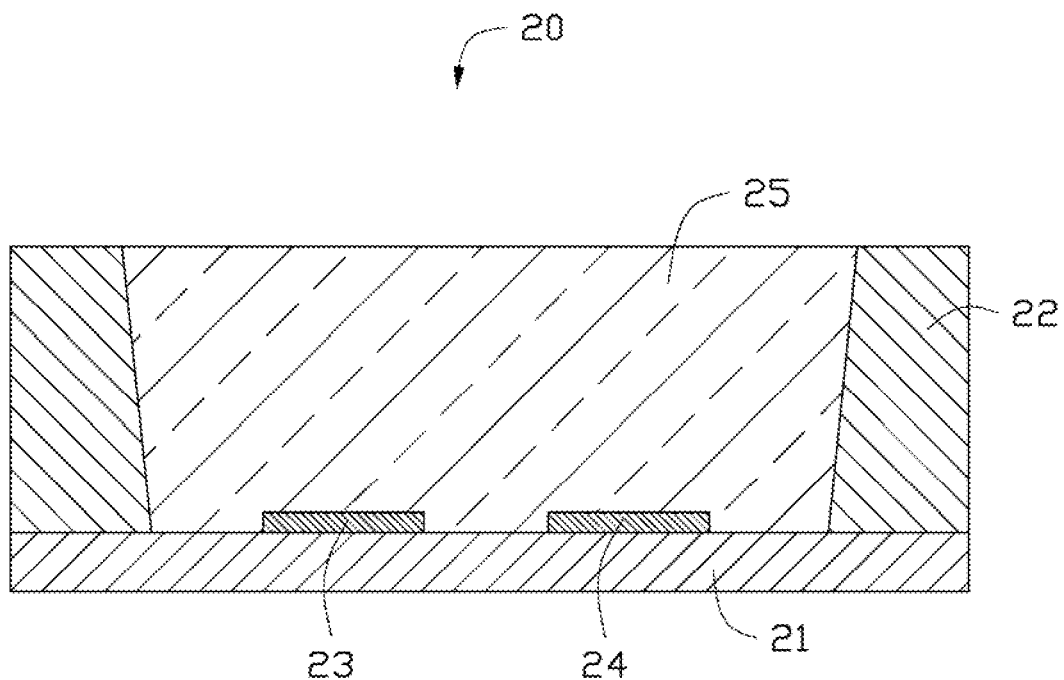
FIG. 4 is a cross sectional view of a light emitting device according to a second embodiment of the present disclosure.

Referring to FIG. 4, a light emitting device 20 in accordance with a second embodiment of present disclosure is provided.

The light emitting device 20 includes a substrate 21, a reflecting cup 22 located on the substrate 21, a first light emitting chip 23 and a second light emitting chip 24, and an encapsulation layer 25 received in the reflecting cup 22 and covering the first light emitting chip 23 and the second light emitting chip 24 therein. The first light emitting chip 23 and the second light emitting chip 24 are mounted on the substrate 11, and are surrounded by the reflecting cup 23. The first light emitting chip 23 emits blue-green light, and the second light emitting chip 24 emits orange-red light. The encapsulation 25 is transparent and made of, for example, silicone. The white light in accordance with present disclosure is obtained by a mixture of the blue-green light emitted from the first light emitting chip 23 and the orange-red light emitted from the second light emitting chip 24.

It is to be understood that the above-described embodiment is intended to illustrate rather than limit the disclosure. Variations may be made to the embodiment without departing from the spirit of the disclosure as claimed. The above-described embodiments illustrate the scope of the disclosure but do not restrict the scope of the disclosure.

What is claimed is:

1. A light emitting device, comprising:
a blue-green light source emitting blue-green light; and
an orange-red light source emitting orange-red light, the blue-green light emitted from the blue-green light source and the orange-red light emitted from the orange-red light source being mixed to obtain white light;
wherein the blue-green light is concentrated at a coordinate (X: 0.1, Y: 0.4) in the CIE1931 xy chromaticity diagram, and the orange-red light is concentrated at a coordinate (X: 0.685, Y: 0.3) in the CIE1931 xy chromaticity diagram;
wherein a range W is inclined along a direction from the blue-green light which is located at an upper, left part of the range W towards the orange-red light which is located at a lower, right part of the range W, and a left edge of the range W is located in the blue-green light and a right edge of the range W is located in the orange-red light; and
wherein, in the range W, two kinds of light at any two points on a straight line through a central point of the range W and equidistant from the central point of the range W are mixed to obtain the white light.

2. The light emitting device of claim 1, wherein a peak wavelength of the blue-green light emitted from the blue-green light source is longer than 490 nm.

3. The light emitting device of claim 1, wherein a peak wavelength of the orange-red light emitted from the orange-red light source is longer than 580 nm.

4. The light emitting device of claim 1, wherein the blue-green light source is a first light emitting chip, the orange-red light source is a fluorescence powder located on light paths of the first light emitting chip.

5. The light emitting device of claim 1, wherein the orange-red light source is a first light emitting chip, the blue-green light source is a fluorescence powder located on light paths of the first light emitting chip.

6. The light emitting device of claim 1, wherein the blue-green light source is a first light emitting chip, the orange-red light source is a second light emitting chip.

7. The light emitting device of claim 6, wherein the first light emitting chip emits blue-green light, and the second light emitting chip emits orange-red light.

8. The light emitting device of claim 1, wherein the blue-green light emitted from the blue-green light source and the orange-red light emitted from the orange-red light are concentrated at opposite parts of the range W in the CIE1931 xy chromaticity diagram.

* * * * *